United States Patent
Takano

(10) Patent No.: US 9,633,903 B2
(45) Date of Patent: Apr. 25, 2017

(54) DEVICE MANUFACTURING METHOD OF PROCESSING CUT PORTIONS OF SEMICONDUCTOR SUBSTRATE USING CARBON DIOXIDE PARTICLES

(71) Applicant: Kabushiki Kaisha Toshiba, Minato-ku, Tokyo (JP)

(72) Inventor: Masamune Takano, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/927,211

(22) Filed: Oct. 29, 2015

(65) Prior Publication Data

US 2016/0218037 A1    Jul. 28, 2016

(30) Foreign Application Priority Data

Jan. 28, 2015    (JP) .................................. 2015-014570

(51) Int. Cl.
H01L 21/78     (2006.01)
H01L 21/768    (2006.01)
H01L 21/02     (2006.01)

(52) U.S. Cl.
CPC ........ *H01L 21/78* (2013.01); *H01L 21/02076* (2013.01); *H01L 21/76894* (2013.01)

(58) Field of Classification Search
CPC ............... H01L 21/76894; H01L 21/78; H01L 21/02076
See application file for complete search history.

(56) References Cited

U.S. PATENT DOCUMENTS

| | | | |
|---|---|---|---|
| 5,888,883 A | 3/1999 | Sasaki et al. | |
| 6,500,758 B1 | 12/2002 | Bowers | |
| 6,653,210 B2 | 11/2003 | Choo et al. | |
| 7,790,578 B2 | 9/2010 | Furui | |
| 2003/0121511 A1 | 7/2003 | Hashimura et al. | |
| 2006/0276006 A1* | 12/2006 | Yang ....................... | H01L 21/78 438/455 |
| 2007/0114488 A1 | 5/2007 | Jackson | |

(Continued)

FOREIGN PATENT DOCUMENTS

| | | |
|---|---|---|
| CN | 1502118 A | 6/2004 |
| CN | 103035572 B | 5/2016 |

(Continued)

OTHER PUBLICATIONS

Korean Office Action issued on Jun. 2, 2016 by the Korean Intellectual Property Office (KIPO) in counterpart Korean Patent application No. 10-2015-0111586, along with English translation thereof.

(Continued)

*Primary Examiner* — Michael Jung
(74) *Attorney, Agent, or Firm* — White & Case LLP

(57) ABSTRACT

A device manufacturing method according to an embodiment includes forming a film on the side of a second surface of a substrate having a first surface and the second surface, cutting the substrate, cutting the film, and injecting particles onto at least one of a first cut portion formed by the cutting of the substrate and a second cut portion formed by the cutting of the film, to process the at least one of the first cut portion or the second cut portion.

8 Claims, 12 Drawing Sheets

(56) References Cited

U.S. PATENT DOCUMENTS

| | | |
|---|---|---|
| 2008/0006302 A1 | 1/2008 | Araki et al. |
| 2008/0213978 A1* | 9/2008 | Henry ............... B08B 5/00 438/462 |
| 2010/0044873 A1 | 2/2010 | Kameyama |
| 2010/0136766 A1* | 6/2010 | Sakamoto ........ B23K 26/0057 438/463 |
| 2011/0265815 A1* | 11/2011 | Mitake ............ H01L 21/67028 134/1.1 |
| 2012/0247504 A1* | 10/2012 | Nasr ................ B08B 7/0035 134/1.1 |
| 2012/0322240 A1 | 12/2012 | Holden et al. |
| 2013/0084658 A1* | 4/2013 | Vaupel ............... H01L 21/78 438/14 |
| 2013/0084659 A1 | 4/2013 | Martens et al. |
| 2013/0267076 A1 | 10/2013 | Lei et al. |
| 2014/0020846 A1 | 1/2014 | Hirakawa et al. |
| 2014/0261570 A1 | 9/2014 | Orii et al. |
| 2015/0020850 A1 | 1/2015 | Kato et al. |
| 2015/0034900 A1* | 2/2015 | Aihara ............... H01L 33/20 257/13 |
| 2015/0104929 A1* | 4/2015 | Lei ..................... H01L 21/78 438/462 |
| 2016/0218037 A1 | 7/2016 | Takano |

FOREIGN PATENT DOCUMENTS

| | | |
|---|---|---|
| JP | 2001-044143 A | 2/2001 |
| JP | 3636835 B2 | 4/2005 |
| JP | 2007-142277 A | 6/2007 |
| JP | 2007-250620 A | 9/2007 |
| JP | 2007-258640 A | 10/2007 |
| JP | 2008-141135 A | 6/2008 |
| JP | 2008-264926 A | 11/2008 |
| JP | 2013-222822 A | 10/2013 |
| JP | 2014-090127 A | 5/2014 |
| JP | 2014-159052 A1 | 9/2014 |
| KR | 10-2014-0083870 A | 7/2014 |
| TW | 200529308 A | 9/2005 |
| TW | 200641985 A | 12/2006 |
| TW | 200811942 A | 3/2008 |
| TW | 201312676 A | 3/2013 |
| TW | 201448018 A | 12/2014 |
| TW | 201507020 A | 2/2015 |

OTHER PUBLICATIONS

Taiwanese Office Action issued on Aug. 17, 2016 in corresponding Taiwanese patent application No. 104128926 along with English translation.

Non-Final Office Action received in U.S. Appl. No. 14/928,482 dated Sep. 28, 2016.

* cited by examiner

DEVICE MANUFACTURING METHOD OF PROCESSING CUT PORTIONS OF SEMICONDUCTOR SUBSTRATE USING CARBON DIOXIDE PARTICLES

CROSS-REFERENCE TO RELATED APPLICATION

This application is based upon and claims the benefit of priority from Japanese Patent Application No. 2015-014570, filed on Jan. 28, 2015, the entire contents of which are incorporated herein by reference.

FIELD

Embodiments described herein relate generally to a device manufacturing method.

BACKGROUND

Semiconductor devices formed on a semiconductor substrate such as a wafer are divided into semiconductor chips by dicing along a dicing region formed on the semiconductor substrate. In a case where a metal film to be the electrodes of the semiconductor devices, or a resin film such as a die bonding film is formed on one of the surfaces of the semiconductor substrate, the metal film or the resin film in the dicing region also needs to be cut at the time of dicing.

As a method of cutting the semiconductor substrate, the metal film, or the resin film, there is a method of cutting a substrate or a film by blade dicing. Where such a method is implemented, shape abnormalities such as burrs are likely to occur at the cut portions of the semiconductor substrate, the metal film, or the resin film. Another example method is a method of cutting a substrate or a film by laser irradiation. Where such a method is implemented, shape abnormalities such as debris are likely to occur at the cut portions of the semiconductor substrate, the metal film, or the resin film. Where shape abnormalities such as burrs and debris occur, the semiconductor chips might fail the external appearance test, or soldering defects might occur between beds and the semiconductor chips. As a result, the production yield becomes lower.

DETAILED DESCRIPTION

Figure 1A:
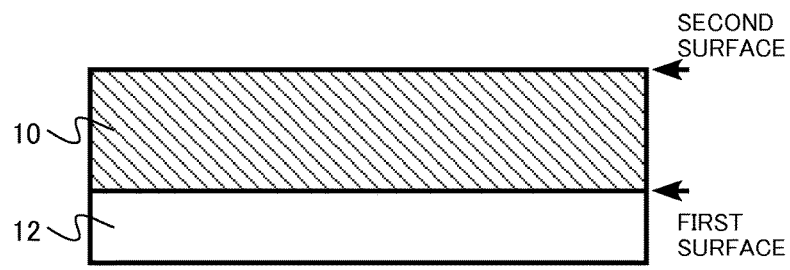
FIGS. 1A, 1B, 1C, 1D, 1E, and 1F are schematic cross-sectional diagrams showing a device manufacturing method according to a first embodiment.

A device manufacturing method according to an embodiment includes: forming a film on the side of a second surface of a substrate having a first surface and the second surface; cutting the substrate; cutting the film; and injecting particles onto at least one of a first cut portion formed by the cutting of the substrate or a second cut portion formed by the cutting of the film, to process the at least one of the first cut portion or the second cut portion.

In this specification, "burrs" means unnecessary protrusions formed on a processed surface or a surface of a workpiece at the time of processing of the workpiece. In this specification, "debris" means shape abnormalities that occur when a vaporized or melted workpiece is re-solidified on a processed surface or a surface of the workpiece at the time of processing of the workpiece with laser irradiation.

The following is a description of embodiments, with reference to the accompanying drawings. In the description below, like or similar components are denoted by like reference numerals, and explanation of components described once will not be repeated.

First Embodiment

A device manufacturing method according to this embodiment includes: forming a film on the side of a second surface of a substrate having a first surface and the second surface; cutting the substrate along a predetermined cutting region; cutting the film along the predetermined cutting region; and injecting particles onto a first cut portion formed by the cutting of the substrate or a second cut portion formed by the cutting of the film, to process the first cut portion or the second cut portion.

An example case where the device to be manufactured is a vertical power MOSFET (Metal Oxide Semiconductor Field Effect Transistor) that has metal electrodes on both surfaces and includes silicon (Si) is described below. In this case, the substrate is a semiconductor substrate. The film is a metal film. In the example case described below, the particles to be injected are particles containing carbon dioxide. The particles containing carbon dioxide (hereinafter also referred to simply as carbon dioxide particles) are particles containing carbon dioxide as a principal component. In addition to carbon dioxide, the particles may contain inevitable impurities, for example.

FIGS. 1A, 1B, 1C, 1D, 1E, and 1F are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10. The protection film is an inorganic insulating film such as a resin film made of polyimide or the like, a silicon nitride film, or a silicon oxide film. The silicon substrate 10 is preferably exposed through the surface of a dicing region formed on the front surface side.

A supporting substrate (a support) 12 is then bonded to the front surface side of the silicon substrate 10 (FIG. 1A). The supporting substrate 12 is quartz glass, for example.

Figure 1B:
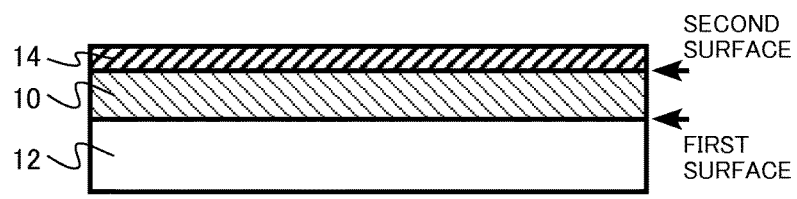

The back surface side of the silicon substrate 10 is ground, so that the silicon substrate 10 becomes thinner. A metal film 14 is then formed on the back surface side of the silicon substrate 10 (FIG. 1B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 1C:
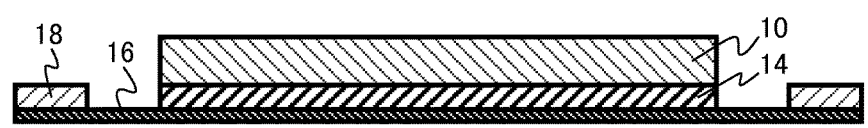

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 1C).

Figure 1D:

The silicon substrate 10 and the metal film 14 are then cut simultaneously along the dicing region formed on the front surface side of the silicon substrate 10 (FIG. 1D). Here, the dicing region is a predetermined cutting region having a predetermined width for dividing semiconductor devices into semiconductor chips by dicing. The dicing region is provided on the front surface side of the silicon substrate 10. The dicing region is also called the dicing street. The patterns of the semiconductor devices are not formed in the dicing region. The dicing region is provided on the front surface side of the silicon substrate 10, and is formed in a grid-like shape so as to divide the semiconductor devices, for example.

The silicon substrate 10 and the metal film 14 are simultaneously cut by blade dicing from the front surface side. The silicon substrate 10 and the metal film 14 are cut with a rotating blade.

Figure 1E:
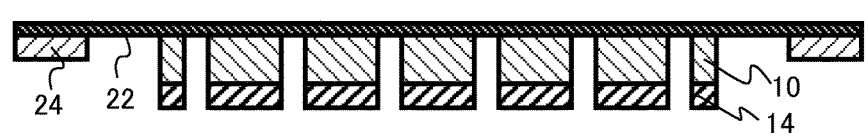

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 1E).

Figure 1F:
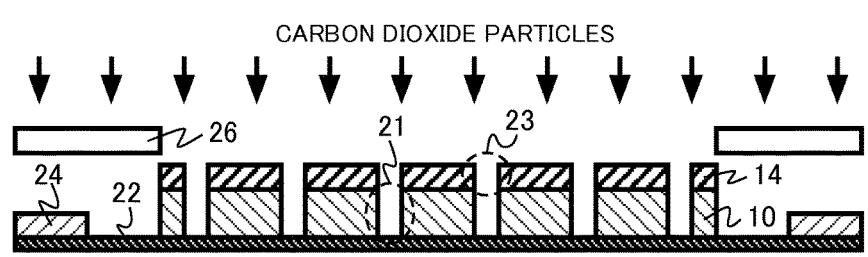

Carbon dioxide particles are then injected onto the metal film 14 from the back surface side (second surface side) of the silicon substrate 10 (FIG. 1F). As the carbon dioxide particles are injected, first cut portions 21 formed by the cutting of the silicon substrate 10, or second cut portions 23 formed by the cutting of the metal film 14 are processed. The first cut portions 21 are the cut surfaces of the cut silicon substrate 10, and the surface portions of the silicon substrate 10 in the vicinities of the cut surfaces. The second cut portions 23 are the cut surfaces of the cut metal film 14, and the surface portions of the metal film 14 in the vicinities of the cut surfaces.

Specifically, the processing of the first cut portions 21 and the second cut portions 23 is the removal of the burrs formed in the first cut portions 21 and the second cut portions 23 by blade dicing. The burrs are scraped off with the carbon dioxide particles, and are thus removed.

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 µm and not greater than 200 µm. The mean particle size of the carbon dioxide particles can be determined by taking an image of the carbon dioxide particles ejected from the nozzle with a high-speed camera, and measuring the lengths of the particles shown in the taken image, for example.

The mean particle size of the carbon dioxide particles is preferably smaller than the width of the first cut portions 21 or the second cut portions 23. With this design, the carbon dioxide particles easily collide with the cut surfaces of the first cut portions 21 or the second cut portions 23, and the effect to remove burrs is increased.

The spot diameter on the surface of the metal film 14 when the carbon dioxide particles are injected onto the metal film 14 is preferably not smaller than ϕ3 mm and not greater than ϕ10 mm, for example.

When the carbon dioxide particles are injected to remove burrs, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

When the carbon dioxide particles are injected to remove burrs, the region of the resin sheet 22 is preferably covered with a mask 26, as shown in FIG. 1F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided MOSFETs are obtained.

Next, the functions and the effects of the device manufacturing method according to this embodiment are described.

In a case where the metal film 14 is also formed on the back surface side of the silicon substrate 10 as in a vertical MOSFET, the metal film 14 on the back surface side in the dicing region also needs to be cut at the time of dicing. In a case where the semiconductor substrate 10 and the metal film 14 are simultaneously cut by blade dicing from the front surface side, for example, the cut surfaces of the silicon substrate 10 in the dicing region become uneven, and so-called burrs are formed. Also, the metal film 14 in the dicing region curl toward the back surface side, and so-called burrs are formed.

If burrs are formed in the silicon substrate 10, there is a possibility that the semiconductor chips will fail the external appearance test, and will not be turned into products, for example. Also, there is a possibility that the strength of each semiconductor chip might become lower at burr portions.

If burrs are formed in the metal film 14, there is also a possibility that the semiconductor chips will fail the external appearance test, and will not be turned into products, for example. Also, when the semiconductor chips and metal beds are joined with joining members such as solders, there is a possibility that soldering defects will occur due to degraded adhesive properties at burr portions.

In this embodiment, after the silicon substrate 10 and the metal film 14 are cut along the dicing region, carbon dioxide particles are injected from the back surface side. The burrs of the silicon substrate 10 or the metal film 14 are removed with the carbon dioxide particles.

It is considered that the burrs of the silicon substrate 10 and the metal film 14 are removed by the physical impact caused mainly by carbon dioxide particles. In addition to that, it is considered that, as the burrs are rapidly cooled by the low-temperature carbon dioxide particles, and the force generated by gasification and expansion of the carbon dioxide that has collided with the burrs is applied, the effect to remove the burrs by physical impact is facilitated.

In this embodiment, when carbon dioxide particles are injected, the carbon dioxide particles are preferably injected in a direction tilting at a smaller angle than 90 degrees with respect to a surface (the second surface) of the metal film 14. As the carbon dioxide particles are injected in a direction tilting at a smaller angle than 90 degrees with respect to a surface (the second surface) of the metal film 14, the particles easily collide with the cut surfaces of the silicon substrate 10 and the metal film 14. Accordingly, the burr removal efficiency becomes higher.

As described above, this embodiment can provide a device manufacturing method that can reduce shape abnormalities when the substrate or the film formed on the substrate is processed.

Second Embodiment

A device manufacturing method according to this embodiment is the same as the device manufacturing method according to the first embodiment, except that particles are injected onto the substrate not from the second surface side of the substrate but from the first surface side of the substrate. Therefore, the same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 2A, 2B, 2C, 2D, and 2E are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to as the front surface) and a second surface (hereinafter also referred to as the back surface). A protection film is then formed on the uppermost layer of the silicon substrate 10.

Figure 2A:
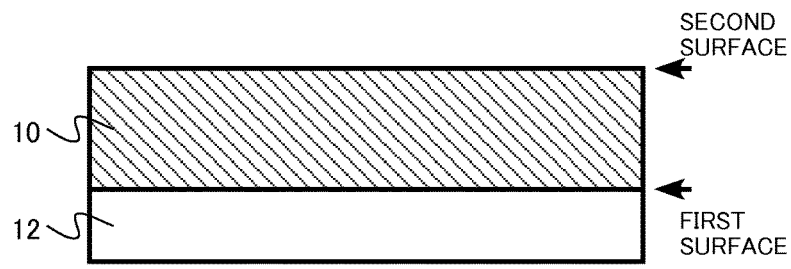
FIGS. 2A, 2B, 2C, 2D, and 2E are schematic cross-sectional diagrams showing a device manufacturing method according to a second embodiment.

A supporting substrate (a support) 12 is then bonded to the front surface side of the silicon substrate 10 (FIG. 2A). The supporting substrate 12 is quartz glass, for example.

Figure 2B:
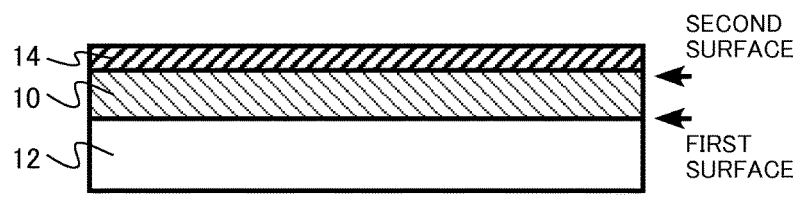

The back surface side of the silicon substrate 10 is ground, so that the silicon substrate 10 becomes thinner. A metal film 14 is then formed on the back surface side of the silicon substrate 10 (FIG. 2B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 2C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 2C).

Figure 2D:
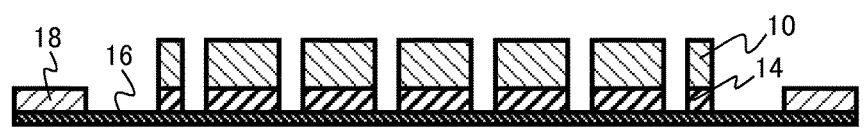

The silicon substrate 10 and the metal film 14 are then cut simultaneously along the dicing region (predetermined cutting region) formed on the front surface side of the silicon substrate 10 (FIG. 2D).

The silicon substrate 10 and the metal film 14 are simultaneously cut by blade dicing from the front surface side (first surface side) of the silicon substrate 10. The silicon substrate 10 and the metal film 14 are cut with a rotating blade.

Figure 2E:
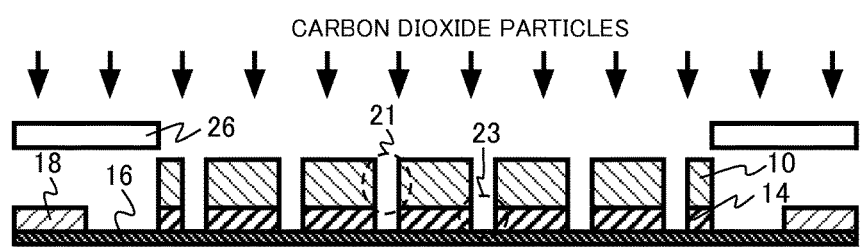

Carbon dioxide particles are then injected onto the silicon substrate 10 from the front surface side (first surface side) of the silicon substrate 10 (FIG. 2E). As the carbon dioxide particles are injected, first cut portions 21 formed by the cutting of the silicon substrate 10, or second cut portions 23 formed by the cutting of the metal film 14 are processed.

Specifically, the processing of the first cut portions 21 and the second cut portions 23 is the removal of the burrs formed in the first cut portions 21 and the second cut portions 23 by blade dicing. The burrs are scraped off with the carbon dioxide particles, and are thus removed.

When the carbon dioxide particles are injected to remove burrs, the resin sheet 16 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

After that, the resin sheet 16 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Third Embodiment

A device manufacturing method according to this embodiment is the same as the device manufacturing method according to the first embodiment, except that the substrate and the film are simultaneously cut by laser irradiation from the first surface side. Therefore, the same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 3A, 3B, 3C, 3D, 3E, and 3F are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 3A:
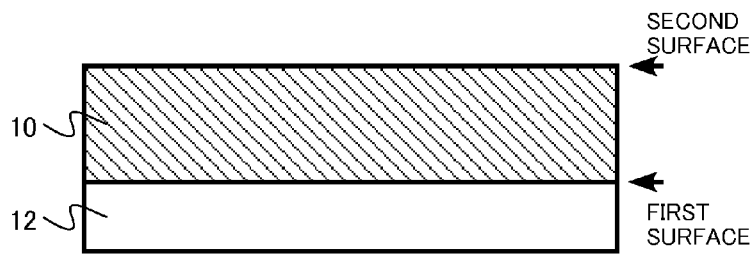
FIGS. 3A, 3B, 3C, 3D, 3E, and 3F are schematic cross-sectional diagrams showing a device manufacturing method according to a third embodiment.

A supporting substrate (a support) 12 is then bonded to the front surface side of the silicon substrate 10 (FIG. 3A). The supporting substrate 12 is quartz glass, for example.

Figure 3B:
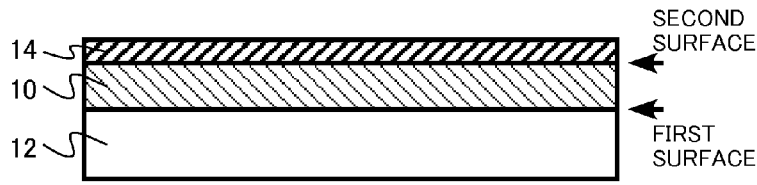

The back surface side of the silicon substrate 10 is ground, so that the silicon substrate 10 becomes thinner. A metal film 14 is then formed on the back surface side of the silicon substrate 10 (FIG. 3B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 3C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 3C).

Figure 3D:

The silicon substrate 10 and the metal film 14 are then cut simultaneously along the dicing region (predetermined cutting region) formed on the front surface side of the silicon substrate 10 (FIG. 3D).

The silicon substrate 10 and the metal film 14 are simultaneously cut by laser irradiation from the front surface side (first surface side) of the silicon substrate 10.

Figure 3E:

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 3E).

Figure 3F:
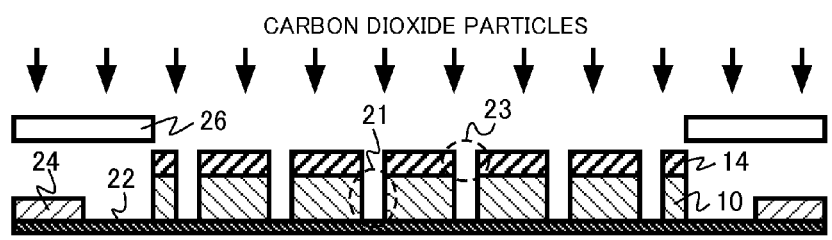

Carbon dioxide particles are then injected onto the metal film 14 from the back surface side (second surface side) of the silicon substrate 10 (FIG. 3F). As the carbon dioxide particles are injected, first cut portions 21 formed by the cutting of the silicon substrate 10, or second cut portions 23 formed by the cutting of the metal film 14 are processed.

Specifically, the processing of the first cut portions 21 and the second cut portions 23 is the removal of the debris formed in the first cut portions 21 and the second cut portions 23 by laser irradiation. The debris is scraped off with the carbon dioxide particles, and is thus removed.

When the carbon dioxide particles are injected to remove debris, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove debris is increased.

After that, the resin sheet 22 on the back surface side of the silicon substrate 10 is removed. As a result, divided MOSFETs are obtained.

As described above, this embodiment can provide a device manufacturing method that can reduce shape abnormalities when the substrate or the film formed on the substrate is processed.

Fourth Embodiment

A device manufacturing method according to this embodiment differs from the device manufacturing method according to the second embodiment in that the substrate and the film are simultaneously cut by laser irradiation from the second surface side. The same aspects as the second embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 4A, 4B, 4C, 4D, and 4E are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 4A:
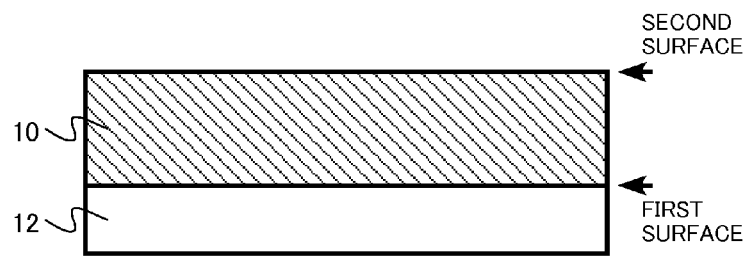
FIGS. 4A, 4B, 4C, 4D, and 4E are schematic cross-sectional diagrams showing a device manufacturing method according to a fourth embodiment.

A supporting substrate (a support) 12 is then bonded to the front surface side of the silicon substrate 10 (FIG. 4A). The supporting substrate 12 is quartz glass, for example.

Figure 4B:
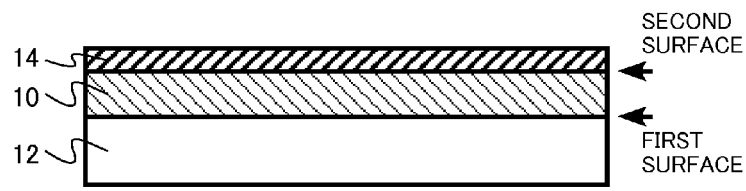

The back surface side of the silicon substrate 10 is ground, so that the silicon substrate 10 becomes thinner. A metal film 14 is then formed on the back surface side of the silicon substrate 10 (FIG. 4B). The metal film 14 is provided substantially on the entire back surface. The supporting substrate 12 is then removed from the silicon substrate 10.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 4C:

A resin sheet 16 is then bonded to the front surface side of the silicon substrate 10. The resin sheet 16 is a so-called dicing sheet. The resin sheet 16 is secured by a metal frame 18, for example. The resin sheet 16 is attached to the front surface of the silicon substrate 10 (FIG. 4C).

Figure 4D:
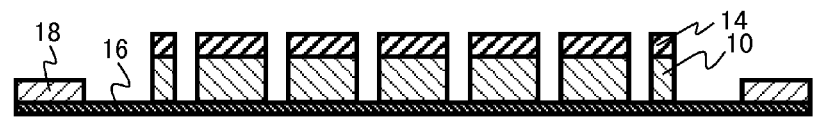

From the back surface side of the silicon substrate 10, the silicon substrate 10 and the metal film 14 are cut simultaneously along the dicing region (predetermined cutting region) formed on the front surface side of the silicon substrate 10 (FIG. 4D).

The silicon substrate 10 and the metal film 14 are simultaneously cut by laser irradiation from the back surface side (second surface side) of the silicon substrate 10.

Figure 4E:
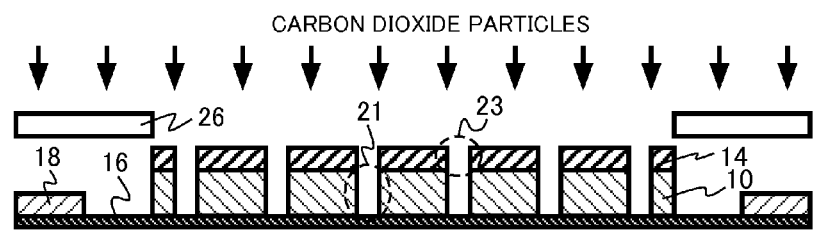

Carbon dioxide particles are then injected onto the silicon substrate 10 from the back surface side (second surface side) of the silicon substrate 10 (FIG. 4E). As the carbon dioxide particles are injected, first cut portions 21 formed by the cutting of the silicon substrate 10, or second cut portions 23 formed by the cutting of the metal film 14 are processed.

Specifically, the processing of the first cut portions 21 and the second cut portions 23 is the removal of the debris formed in the first cut portions 21 and the second cut portions 23 by laser irradiation. The debris is scraped off with the carbon dioxide particles, and is thus removed.

When the carbon dioxide particles are injected to remove debris, the resin sheet 16 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove debris is increased.

After that, the resin sheet 16 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Fifth Embodiment

A device manufacturing method according to this embodiment differs from the device manufacturing method according to the fourth embodiment in that the substrate is cut by laser irradiation from the second surface side, and the film is cut by blade dicing from the second surface side. The same aspects as the fourth embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 5A, 5B, 5C, 5D, 5E, and 5F are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 5A:
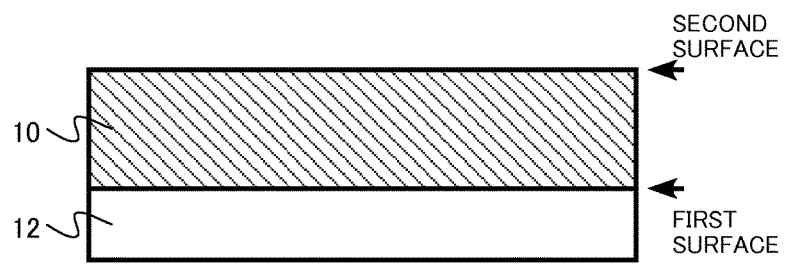
FIGS. 5A, 5B, 5C, 5D, 5E, and 5F are schematic cross-sectional diagrams showing a device manufacturing method according to a fifth embodiment.

A supporting substrate (a support) 12 is then bonded to the front surface side of the silicon substrate 10 (FIG. 5A). The supporting substrate 12 is quartz glass, for example.

Figure 5B:
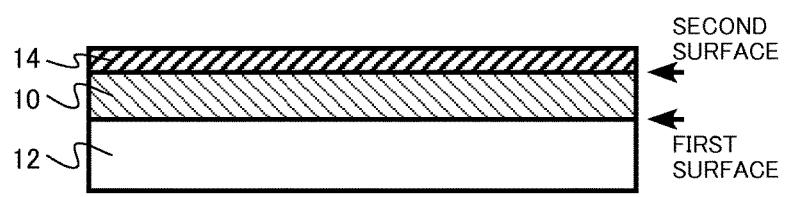

The back surface side of the silicon substrate 10 is ground, so that the silicon substrate 10 becomes thinner. A metal film 14 is then formed on the back surface side of the silicon substrate 10 (FIG. 5B). The metal film 14 is provided substantially on the entire back surface. The supporting substrate 12 is then removed from the silicon substrate 10.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 5C:

A resin sheet 16 is then bonded to the front surface side (first surface side) of the silicon substrate 10. The resin sheet 16 is a so-called dicing sheet. The resin sheet 16 is secured by a metal frame 18, for example. The resin sheet 16 is attached to the front surface of the silicon substrate 10 (FIG. 5C).

Figure 5D:

The metal film 14 is then cut along the dicing region (predetermined cutting region) formed on the front surface side of the silicon substrate 10 (FIG. 5D). The metal film 14 is cut by laser irradiation from the back surface side (second surface side) of the silicon substrate 10.

Figure 5E:

The silicon substrate 10 is then cut along the dicing region (FIG. 5E). The silicon substrate 10 is cut by blade dicing from the back surface side (second surface side) of the silicon substrate 10.

Figure 5F:
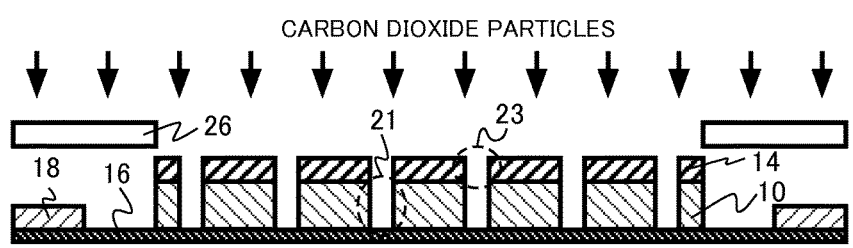

Carbon dioxide particles are then injected onto the silicon substrate 10 from the back surface side (second surface side) of the silicon substrate 10 (FIG. 5F). As the carbon dioxide particles are injected, first cut portions 21 formed by the cutting of the silicon substrate 10, or second cut portions 23 formed by the cutting of the metal film 14 are processed.

Specifically, the processing of the first cut portions 21 is the removal of the burrs formed in the first cut portions 21 by blade dicing. The burrs are scraped off with the carbon dioxide particles, and are thus removed. The processing of the second cut portions 23 is the removal of the debris formed in the second cut portions 23 by laser irradiation. The debris is scraped off with the carbon dioxide particles, and is thus removed.

So as to increase the process margin, the cut width at the time of the cutting of the metal film 14 is preferably greater than the cut width at the time of the cutting of the silicon substrate 10.

When the carbon dioxide particles are injected to remove burrs and debris, the resin sheet 16 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs and debris is increased.

After that, the resin sheet 16 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Sixth Embodiment

A device manufacturing method according to this embodiment differs from the device manufacturing method according to the fifth embodiment in that the particles are injected before the substrate is cut. Part of explanation of the same aspects as those of the fifth embodiment will not be repeated.

An example case where the device to be manufactured is a vertical power MOSFET that includes a metal electrode on either surface and contains silicon (Si) is described below. In the example case described below, the particles to be injected are particles containing carbon dioxide.

FIGS. 6A, 6B, 6C, 6D, 6E, and 6F are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 6A:
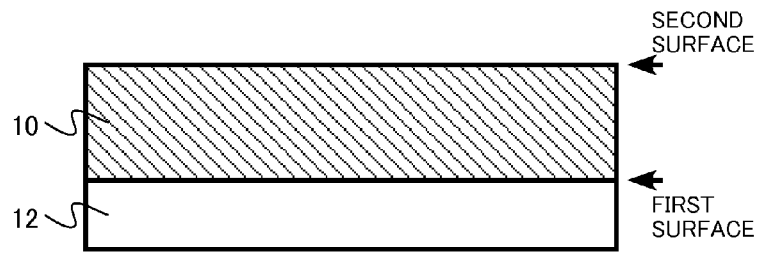
FIGS. 6A, 6B, 6C, 6D, 6E, and 6F are schematic cross-sectional diagrams showing a device manufacturing method according to a sixth embodiment.

A supporting substrate (a support) 12 is then bonded to the front surface side of the silicon substrate 10 (FIG. 6A). The supporting substrate 12 is quartz glass, for example.

Figure 6B:
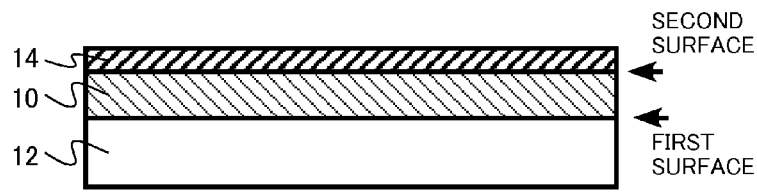

The back surface side of the silicon substrate 10 is ground, so that the silicon substrate 10 becomes thinner. A metal film 14 is then formed on the back surface side of the silicon substrate 10 (FIG. 6B). The metal film 14 is provided substantially on the entire back surface. The supporting substrate 12 is then removed from the silicon substrate 10.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 μm and not greater than 1.0 μm, for example.

Figure 6C:
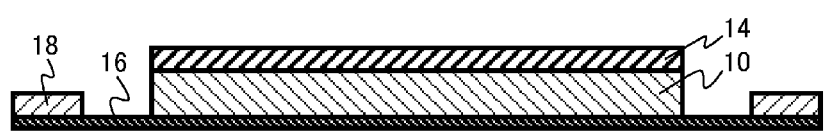

A resin sheet 16 is then bonded to the front surface side (first surface side) of the silicon substrate 10. The resin sheet 16 is a so-called dicing sheet. The resin sheet 16 is secured by a metal frame 18, for example. The resin sheet 16 is attached to the front surface of the silicon substrate 10 (FIG. 6C).

Figure 6D:

The metal film 14 is then cut along the dicing region (predetermined cutting region) formed on the front surface side of the silicon substrate 10 (FIG. 6D). The metal film 14 is cut by laser irradiation from the back surface side (second surface side) of the silicon substrate 10.

Figure 6E:
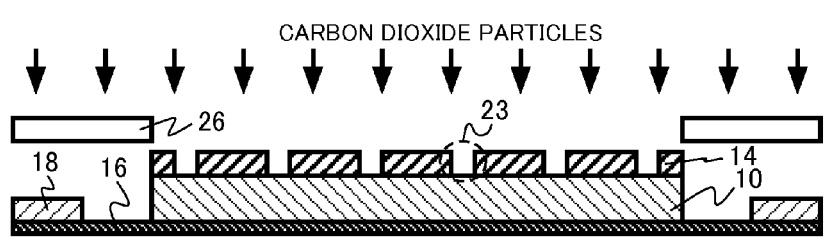

Carbon dioxide particles are then injected onto the silicon substrate 10 from the back surface side (second surface side) of the silicon substrate 10 (FIG. 6E). As the carbon dioxide particles are injected, second cut portions 23 formed by the cutting of the metal film 14 are processed.

Specifically, the processing of the second cut portions 23 is the removal of the debris formed in the second cut portions 23 by laser irradiation. The debris is scraped off with the carbon dioxide particles, and is thus removed.

Figure 6F:

The silicon substrate 10 is then cut along the dicing region (FIG. 6F). The silicon substrate 10 is cut by blade dicing from the back surface side (second surface side) of the silicon substrate 10.

So as to increase the process margin, the cut width at the time of the cutting of the metal film 14 is preferably greater than the cut width at the time of the cutting of the silicon substrate 10.

After that, the resin sheet 16 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Seventh Embodiment

A device manufacturing method according to this embodiment differs from the device manufacturing method according to the first embodiment in that the substrate is cut by plasma dicing from the first surface side, and the film is cut by laser irradiation from the second surface side. The same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 7A, 7B, 7C, 7D, 7E, 7F, and 7G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 7A:
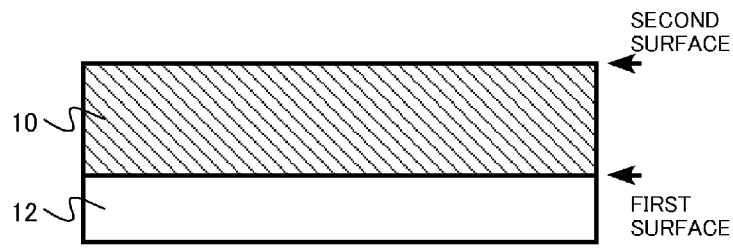
FIGS. 7A, 7B, 7C, 7D, 7E, 7F, and 7G are schematic cross-sectional diagrams showing a device manufacturing method according to a seventh embodiment.

A supporting substrate (a support) 12 is then bonded to the front surface side of the silicon substrate 10 (FIG. 7A). The supporting substrate 12 is quartz glass, for example.

Figure 7B:
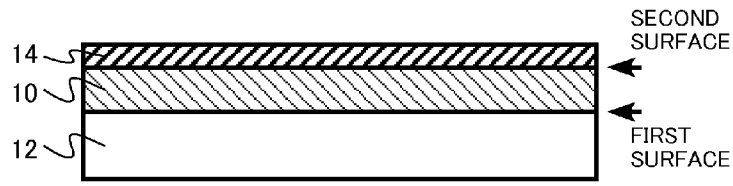

The back surface side of the silicon substrate 10 is ground, so that the silicon substrate 10 becomes thinner. A metal film 14 is then formed on the back surface side of the silicon substrate 10 (FIG. 7B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 μm and not greater than 1.0 μm, for example.

Figure 7C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 7C).

Figure 7D:
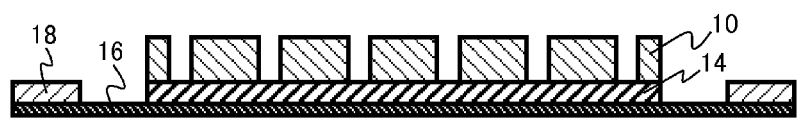

The silicon substrate 10 is then cut, from the front surface side, along the dicing region (predetermined cutting region) formed on the front surface side of the silicon substrate 10 in such a manner that the metal film 14 on the back surface side is exposed (FIG. 7D).

The silicon substrate 10 is cut by plasma etching. The plasma etching is a so-called Bosch process in which an isotropic etching step using F-based radicals, a protection film forming step using $CF_4$-based radicals, and an anisotropic etching step using F-based ions are repeated, for example.

Figure 7E:
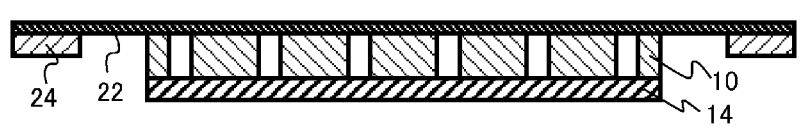

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 7E).

Figure 7F:

The metal film 14 is then cut along the dicing region (predetermined cutting region) formed on the front surface side of the silicon substrate 10 (FIG. 7F). The metal film 14 is cut by laser irradiation from the back surface side (second surface side) of the silicon substrate 10.

Figure 7G:
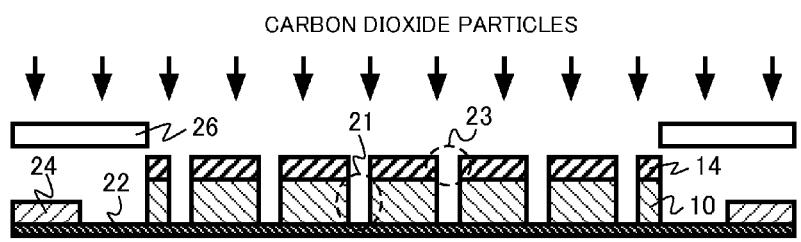

Carbon dioxide particles are then injected onto the metal film 14 from the back surface side (second surface side) of the silicon substrate 10 (FIG. 7G). As the carbon dioxide particles are injected, first cut portions 21 formed by the cutting of the silicon substrate 10, or second cut portions 23 formed by the cutting of the metal film 14 are processed.

Specifically, the processing of the first cut portions 21 is the removal of the burrs formed in the first cut portions 21 by plasma etching. The processing of the second cut portions 23 is the removal of the debris formed in the second cut portions 23 by laser irradiation. The burrs and the debris are scraped off with the carbon dioxide particles, and are thus removed.

When the carbon dioxide particles are injected to remove burrs and debris, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs and debris is increased.

After that, the resin sheet 22 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Eighth Embodiment

A device manufacturing method according to this embodiment differs from the device manufacturing method according to the first embodiment in that the substrate is cut by plasma dicing from the first surface side, the film is cut by injecting of particles from the second surface side, and the first cut portions and the second cut portions are then processed by injecting of particles. The same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 8A, 8B, 8C, 8D, 8E, 8F, and 8G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 8A:
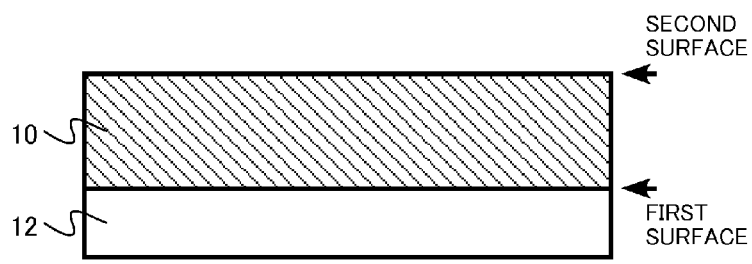
FIGS. 8A, 8B, 8C, 8D, 8E, 8F, and 8G are schematic cross-sectional diagrams showing a device manufacturing method according to an eighth embodiment.

A supporting substrate (a support) 12 is then bonded to the front surface side of the silicon substrate 10 (FIG. 8A). The supporting substrate 12 is quartz glass, for example.

Figure 8B:
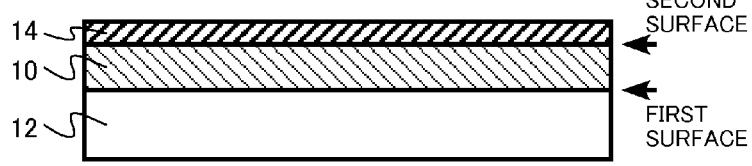

The back surface side of the silicon substrate 10 is ground, so that the silicon substrate 10 becomes thinner. A metal film 14 is then formed on the back surface side of the silicon substrate 10 (FIG. 8B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 8C:
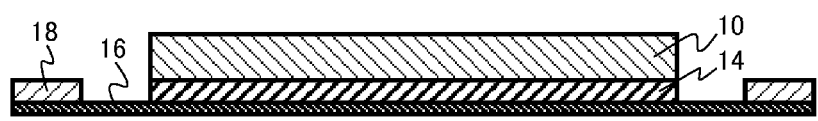

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 8C).

Figure 8D:
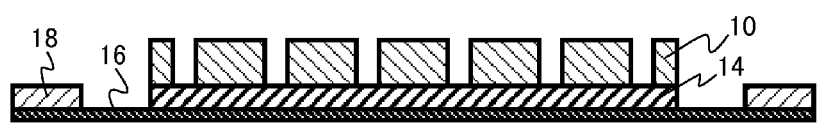

The silicon substrate 10 is then cut, from the front surface side, along the dicing region (predetermined cutting region) formed on the front surface side of the silicon substrate 10 in such a manner that the metal film 14 on the back surface side is exposed (FIG. 8D).

The silicon substrate 10 is cut by plasma etching. The plasma etching is a so-called Bosch process in which an isotropic etching step using F-based radicals, a protection film forming step using $CF_4$-based radicals, and an anisotropic etching step using F-based ions are repeated, for example.

Figure 8E:

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 8E).

Figure 8F:
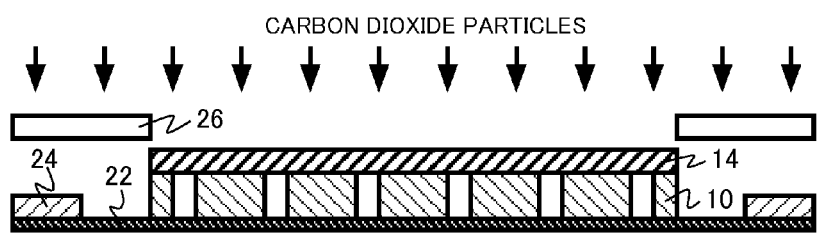

Carbon dioxide particles are then injected onto the metal film 14 from the back surface side of the silicon substrate 10 (FIG. 8F). The carbon dioxide particles are injected perpendicularly to a surface (the second surface) of the metal film 14, for example.

As the carbon dioxide particles are injected, the metal film 14 on the back surface side of the portions where the silicon substrate 10 has been cut is cut. By virtue of the carbon dioxide particles, the metal film 14 is physically scraped off into hollow portions, and is thus cut.

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 µm and not greater than 200 µm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the metal film 14 when the carbon dioxide particles are injected onto the metal film 14 is preferably not smaller than $\phi 3$ mm and not greater than $\phi 10$ mm, for example.

When the carbon dioxide particles are injected to remove the metal film 14, the region of the resin sheet 22 is preferably covered with a mask 26, as shown in FIG. 8F. As the region of the resin sheet 22 is covered with the mask 26, the resin sheet 22 can be prevented from coming off the frame 24 due to the impact caused by the carbon dioxide particles, for example. The mask 26 is made of a metal, for example.

Figure 8G:
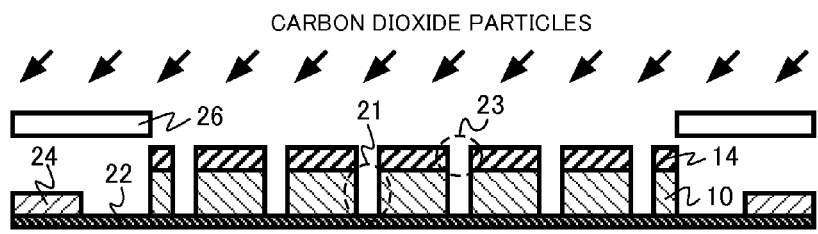

Carbon dioxide particles are then injected onto the metal film 14 from the back surface side (second surface side) of the silicon substrate 10 (FIG. 8G). As the carbon dioxide particles are injected, first cut portions 21 formed by the cutting of the silicon substrate 10, or second cut portions 23 formed by the cutting of the metal film 14 are processed.

Specifically, the processing of the first cut portions 21 is the removal of the burrs formed in the first cut portions 21 by plasma etching. The processing of the second cut portions 23 is the removal of the burrs formed in the second cut portions 23. The burrs are scraped off with the carbon dioxide particles, and are thus removed.

The carbon dioxide particles are injected in a direction tilting at a smaller angle than 90 degrees with respect to a surface (the second surface) of the metal film 14. As the carbon dioxide particles are injected in a direction tilting at a smaller angle than 90 degrees with respect to a surface (the second surface) of the metal film 14, the particles easily collide with the cut surfaces of the silicon substrate 10 and the metal film 14. Accordingly, the burr removal efficiency becomes higher.

When the carbon dioxide particles are injected to remove burrs, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

After that, the resin sheet 22 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Ninth Embodiment

A device manufacturing method according to this embodiment differs from the device manufacturing method according to the first embodiment in that the substrate is cut in such a manner that the substrate remains, the film and the remaining substrate are cut by injecting of particles from the second surface side, and the first cut portions and the second cut portions are then processed by injecting of particles. The same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 9A, 9B, 9C, 9D, 9E, 9F, and 9G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 9A:
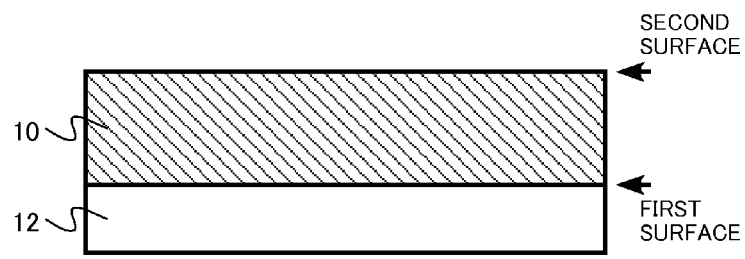
FIGS. 9A, 9B, 9C, 9D, 9E, 9F, and 9G are schematic cross-sectional diagrams showing a device manufacturing method according to a ninth embodiment.

A supporting substrate (a support) 12 is then bonded to the front surface side of the silicon substrate 10 (FIG. 9A). The supporting substrate 12 is quartz glass, for example.

Figure 9B:
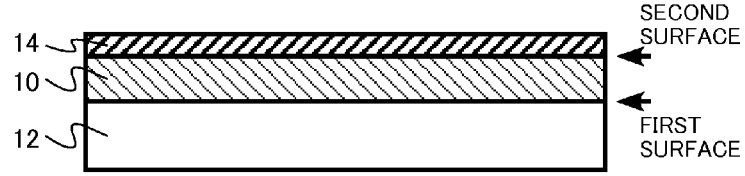

The back surface side of the silicon substrate 10 is ground, so that the silicon substrate 10 becomes thinner. A metal film 14 is then formed on the back surface side of the silicon substrate 10 (FIG. 9B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 9C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 9C).

Figure 9D:
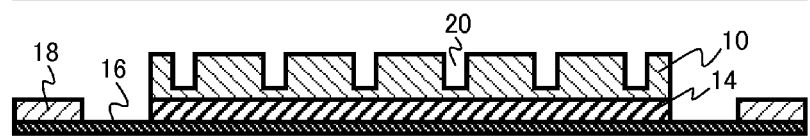

Grooves 20 are then formed along the dicing region (predetermined cutting region) provided on the front surface side of the silicon substrate 10 in such a manner that the silicon substrate 10 on the back surface side partially remains (FIG. 9D). The semiconductor substrate on the back surface side of the trenches 20 is made to remain with a thickness of 20 µm or less, or more preferably, 10 µm or less.

The trenches 20 are formed by blade dicing, for example. The trenches 20 can also be formed by plasma etching, for example.

Figure 9E:
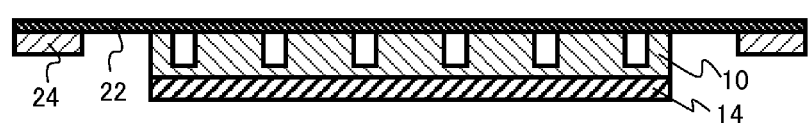

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 9E).

Figure 9F:
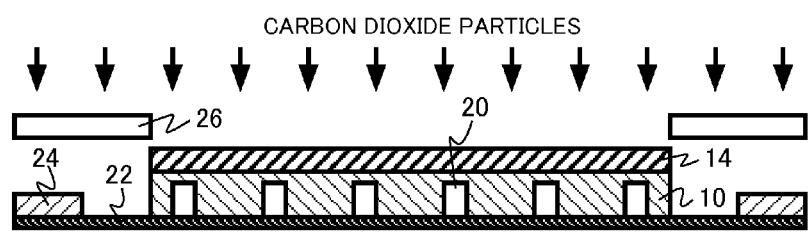

Carbon dioxide particles are then injected onto the metal film 14 from the back surface side of the silicon substrate 10 (FIG. 9F). The carbon dioxide particles are injected perpendicularly to a surface (the second surface) of the metal film 14, for example.

As the carbon dioxide particles are injected, the metal film 14 and the remaining silicon substrate 10 on the back surface side of the portions having the trenches 20 formed therein are cut. By virtue of the carbon dioxide particles, the metal film 14 and the silicon substrate 10 are scraped off into the trenches 20 that are hollow portions in physical terms, and are thus cut.

Figure 9G:
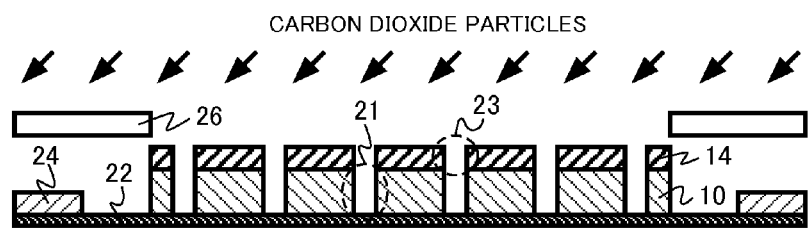

Carbon dioxide particles are then injected onto the metal film 14 from the back surface side (second surface side) of the silicon substrate 10 (FIG. 9G). As the carbon dioxide particles are injected, first cut portions 21 formed by the cutting of the silicon substrate 10, or second cut portions 23 formed by the cutting of the metal film 14 are processed.

Specifically, the processing of the first cut portions 21 and the second cut portion 23 is the removal of the burrs formed in the first cut portions 21 by blade dicing. The processing is also the removal of the burrs formed in the second cut portions 23. The burrs are scraped off with the carbon dioxide particles, and are thus removed.

The carbon dioxide particles are injected in a direction tilting at a smaller angle than 90 degrees with respect to a surface (the second surface) of the metal film 14. As the carbon dioxide particles are injected in a direction tilting at a smaller angle than 90 degrees with respect to a surface (the second surface) of the metal film 14, the particles easily collide with the cut surfaces of the silicon substrate 10 and the metal film 14. Accordingly, the burr removal efficiency becomes higher.

When the carbon dioxide particles are injected to remove burrs, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

After that, the resin sheet 22 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Tenth Embodiment

A device manufacturing method according to this embodiment differs from the device manufacturing method according to the first embodiment in that the substrate is cut in such a manner that the film is exposed, and the film is cut by injecting of particles from the second surface side after the first cut portions are processed by injecting of particles from the first surface side. The same aspects as the first embodiment will not be fully described.

An example case where the device to be manufactured is a vertical power MOSFET that includes a metal electrode on either surface and contains silicon (Si) is described below. In the example case described below, the particles to be injected are particles containing carbon dioxide.

FIGS. 10A, 10B, 10C, 10D, 10E, 10F, and 10G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A protection film is then formed on the uppermost layer of the silicon substrate 10.

Figure 10A:
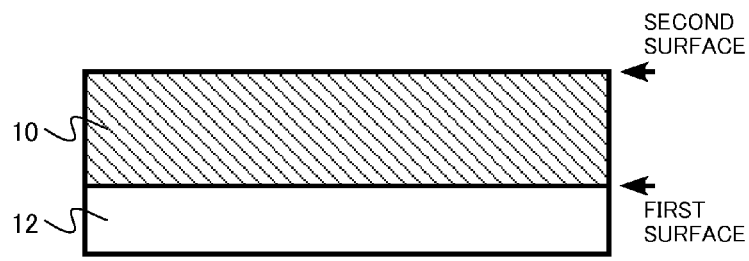
FIGS. 10A, 10B, 10C, 10D, 10E, 10F, and 10G are schematic cross-sectional diagrams showing a device manufacturing method according to a tenth embodiment.

A supporting substrate (a support) 12 is then bonded to the front surface side of the silicon substrate 10 (FIG. 10A). The supporting substrate 12 is quartz glass, for example.

Figure 10B:
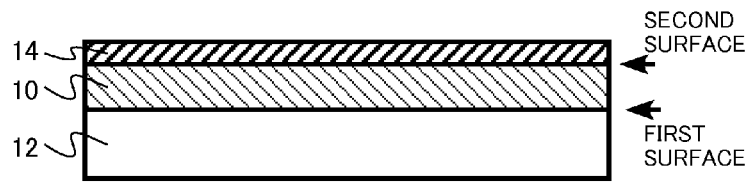

The back surface side of the silicon substrate 10 is ground, so that the silicon substrate 10 becomes thinner. A metal film 14 is then formed on the back surface side of the silicon substrate 10 (FIG. 10B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 10C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 10C).

Figure 10D:
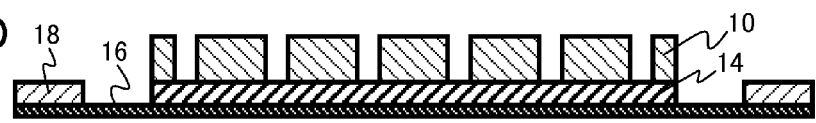

The silicon substrate 10 is then cut, from the front surface side, along the dicing region (predetermined cutting region) formed on the front surface side of the silicon substrate 10 in such a manner that the metal film 14 on the back surface side is exposed (FIG. 10D).

The silicon substrate 10 is cut by blade dicing, for example. The silicon substrate 10 can also be cut by plasma etching, for example.

Figure 10E:
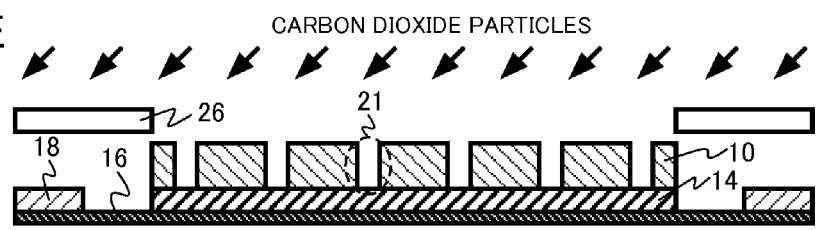

Carbon dioxide particles are then injected onto the silicon substrate 10 from the front surface side of the silicon substrate 10 (FIG. 10E). As the carbon dioxide particles are injected, first cut portions 21 formed by the cutting of the silicon substrate 10 are processed.

Specifically, the processing of the first cut portions 21 is the removal of the burrs formed in the first cut portions 21 by blade dicing. The burrs are scraped off with the carbon dioxide particles, and are thus removed.

The carbon dioxide particles are injected in a direction tilting at a smaller angle than 90 degrees with respect to a surface (the first surface) of the silicon substrate 10. As the carbon dioxide particles are injected in a direction tilting at a smaller angle than 90 degrees with respect to a surface (the first surface) of the silicon substrate 10, the particles easily collide with the cut surfaces of the silicon substrate 10. Accordingly, the burr removal efficiency becomes higher.

Figure 10F:
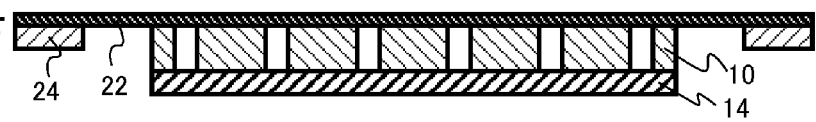

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 10F).

Figure 10G:
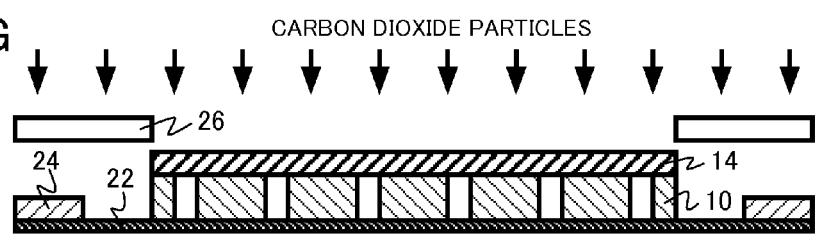

Carbon dioxide particles are then injected onto the metal film 14 from the back surface side of the silicon substrate 10 (FIG. 10G). The carbon dioxide particles are injected perpendicularly to a surface (the second surface) of the metal film 14, for example.

As the carbon dioxide particles are injected, the metal film 14 on the back surface side of the portions in which the first cut portions 21 have been formed is cut. By virtue of the carbon dioxide particles, the metal film 14 is physically scraped off into hollow portions, and is thus cut.

After that, the resin sheet 22 on the front surface side of the silicon substrate 10 is removed. As a result, divided MOSFETs are obtained.

As described above, this embodiment can provide a device manufacturing method that can reduce shape abnormalities when the substrate or the film formed on the substrate is processed.

Eleventh Embodiment

A device manufacturing method according to this embodiment differs from the device manufacturing method according to the first embodiment in that a semiconductor device including a resin film, instead of a metal film, on the second surface side of the substrate 10 is to be manufactured. In the description below, the same aspects as the first embodiment will not be explained.

An example case where the device to be manufactured is a semiconductor memory that includes a resin film on the back surface side and contains silicon (Si) is described below.

FIGS. 11A, 11B, 11C, 11D, 11E, and 11F are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (the substrate) 10 having a first surface (hereinafter referred to the front surface) and a second surface (hereinafter also referred to as the back surface). A protection film is then formed on the uppermost layer of the silicon substrate 10. The protection film is an inorganic insulating film such as a resin film made of polyimide or the like, a silicon nitride film, or a silicon oxide film.

Figure 11A:
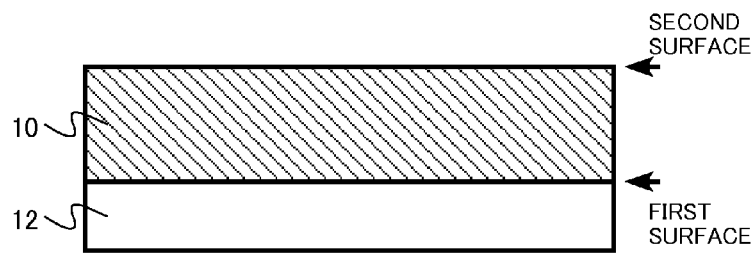
FIGS. 11A, 11B, 11C, 11D, 11E, and 11F are schematic cross-sectional diagrams showing a device manufacturing method according to an eleventh embodiment.

A supporting substrate (a support) 12 is then bonded to the front surface side of the silicon substrate 10 (FIG. 11A). The supporting substrate 12 is quartz glass, for example.

Figure 11B:
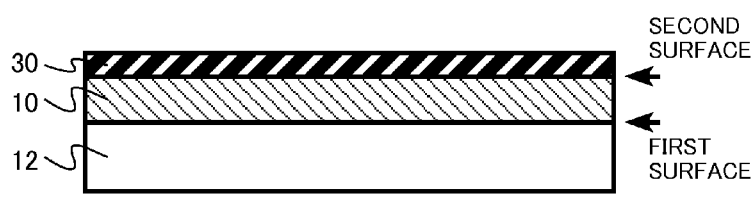

The back surface side of the silicon substrate 10 is ground, so that the silicon substrate 10 becomes thinner. A resin film 30 is then formed on the back surface side of the silicon substrate 10 (FIG. 11B). The resin film 30 is provided substantially on the entire back surface.

The resin film 30 is a DAF (Die Attach Film) for bonding divided semiconductor chips onto the substrate, for example. The thickness of the resin film 30 is not smaller than 10 μm and not greater than 200 μm, for example.

Figure 11C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 11C).

Figure 11D:

The silicon substrate 10 and the resin film 30 are then cut simultaneously along the dicing region formed on the front surface side of the silicon substrate 10 (FIG. 11D). Here, the dicing region is the predetermined cutting region having a predetermined width for dividing semiconductor devices into semiconductor chips by dicing, and is provided on the front surface side of the silicon substrate 10. The dicing region is also called the dicing street. The patterns of the semiconductor devices are not formed in the dicing region. The dicing region is provided on the front surface side of the silicon substrate 10, and is formed in a grid-like shape so as to divide the semiconductor devices, for example.

The silicon substrate 10 and the resin film 30 are simultaneously cut by blade dicing from the front surface side. The silicon substrate 10 and the resin film 30 are cut with a rotating blade.

Figure 11E:

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the protection film and the metal electrodes on the front surface side. The resin sheet 16 on the back surface side is then removed (FIG. 11E).

Figure 11F:
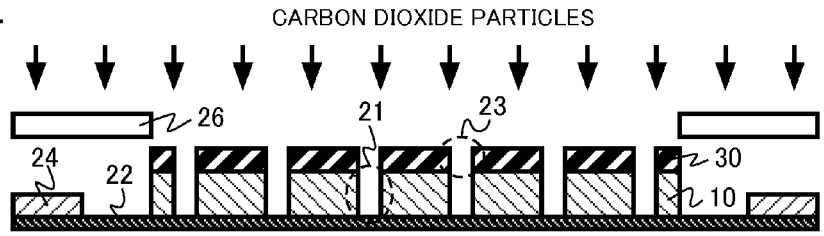

Carbon dioxide particles are then injected onto the resin film 30 from the back surface side (second surface side) of the silicon substrate 10 (FIG. 11F). As the carbon dioxide particles are injected, first cut portions 21 formed by the cutting of the silicon substrate 10, or second cut portions 23 formed by the cutting of the resin film 30 are processed.

Specifically, the processing of the first cut portions 21 and the second cut portions 23 is the removal of the burrs formed in the first cut portions 21 and the second cut portions 23 by blade dicing. The burrs are scraped off with the carbon dioxide particles, and are thus removed.

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the resin film 30. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the resin film 30 when the carbon dioxide particles are injected onto the resin film 30 is preferably not smaller than $\phi$3 mm and not greater than $\phi$10 mm, for example.

When the carbon dioxide particles are injected to remove burrs, the resin sheet 22 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

When the carbon dioxide particles are injected to remove burrs, the region of the resin sheet 22 is preferably covered with a mask 26, as shown in FIG. 11F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided semiconductor memories are obtained.

As described above, this embodiment can provide a device manufacturing method that can reduce shape abnormalities when the substrate or the film formed on the substrate is processed.

Twelfth Embodiment

A device manufacturing method according to this embodiment differs from the device manufacturing method according to the second embodiment in that a semiconductor device including a resin film, instead of a metal film, on the second surface side of the substrate is to be manufactured. In the description below, the same aspects as the second embodiment will not be explained.

An example case where the device to be manufactured is a semiconductor memory that includes a resin film on the back surface side and contains silicon (Si) is described below.

FIGS. 12A, 12B, 12C, 12D, and 12E are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (the substrate) 10 having a first surface (hereinafter referred to the front surface) and a second surface (hereinafter also referred to as the back surface). A protection film is then formed on the uppermost layer of the silicon substrate 10. The protection film is an inorganic insulating film such as a resin film made of polyimide or the like, a silicon nitride film, or a silicon oxide film.

Figure 12A:
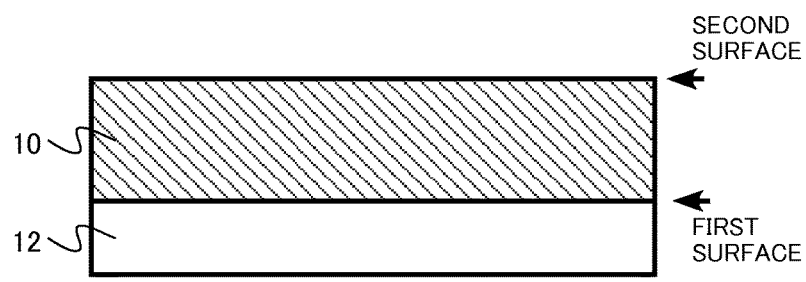
FIGS. 12A, 12B, 12C, 12D, and 12E are schematic cross-sectional diagrams showing a device manufacturing method according to a twelfth embodiment.

A supporting substrate (a support) 12 is then bonded to the front surface side of the silicon substrate 10 (FIG. 12A). The supporting substrate 12 is quartz glass, for example.

Figure 12B:
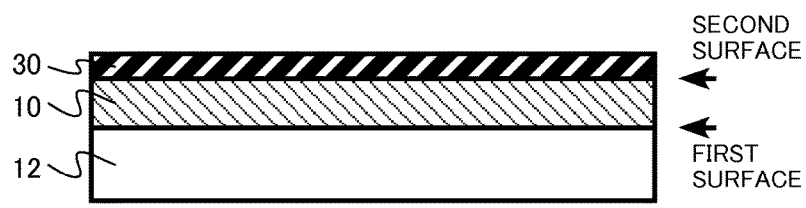

The back surface side of the silicon substrate 10 is ground, so that the silicon substrate 10 becomes thinner. A resin film 30 is then formed on the back surface side of the silicon substrate 10 (FIG. 12B). The resin film 30 is provided substantially on the entire back surface.

The resin film 30 is a DAF (Die Attach Film) for bonding divided semiconductor chips onto the substrate, for example. The thickness of the resin film 30 is not smaller than 10 μm and not greater than 200 μm, for example.

Figure 12C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 12C).

Figure 12D:
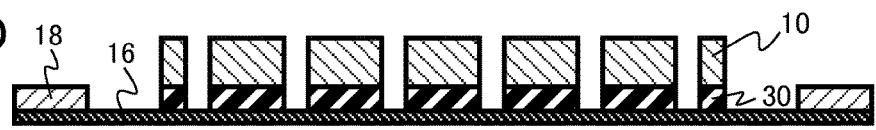

The silicon substrate 10 and the resin film 30 are then cut simultaneously along the dicing region (predetermined cutting region) formed on the front surface side of the silicon substrate 10 (FIG. 12D). Here, the dicing region is the predetermined cutting region having a predetermined width for dividing semiconductor devices into semiconductor chips by dicing, and is provided on the front surface side of the silicon substrate 10. The dicing region is also called the dicing street. The patterns of the semiconductor devices are not formed in the dicing region. The dicing region is provided on the front surface side of the silicon substrate 10, and is formed in a grid-like shape so as to divide the semiconductor devices, for example.

The silicon substrate 10 and the resin film 30 are simultaneously cut by blade dicing from the front surface side. The silicon substrate 10 and the resin film 30 are cut with a rotating blade.

Figure 12E:
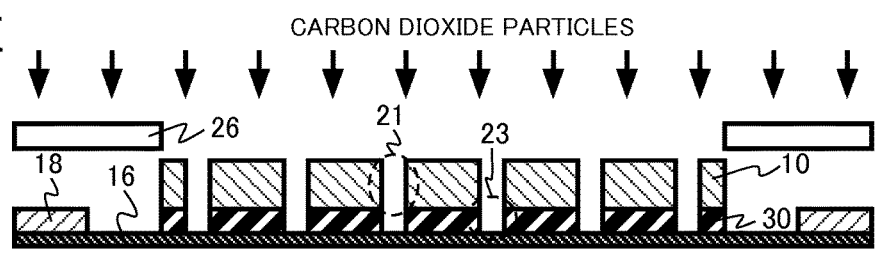

Carbon dioxide particles are then injected onto the silicon substrate 10 from the front surface side (first surface side) of the silicon substrate 10 (FIG. 12E). As the carbon dioxide particles are injected, first cut portions 21 formed by the cutting of the silicon substrate 10, or second cut portions 23 formed by the cutting of the resin film 30 are processed.

Specifically, the processing of the first cut portions 21 and the second cut portions 23 is the removal of the burrs formed in the first cut portions 21 and the second cut portions 23 by blade dicing. The burrs are scraped off with the carbon dioxide particles, and are thus removed.

When the carbon dioxide particles are injected to remove burrs, the resin sheet 16 is preferably expanded to increase the widths of the first cut portions 21 and the second cut portions 23. As the widths of the first cut portions 21 and the second cut portions 23 become greater, the carbon dioxide particles easily collide with the cut surfaces of the first cut portions 21 or the second cut portions 23, and the effect to remove burrs is increased.

After that, the resin sheet 16 on the front surface side of the silicon substrate 10 is removed. As a result, divided semiconductor memories are obtained.

As described above, this embodiment can provide a device manufacturing method that can reduce shape abnormalities when the substrate or the film formed on the substrate is processed.

In the first through twelfth embodiments, the semiconductor devices are vertical MOSFETs or semiconductor memories. However, the semiconductor devices are not limited to vertical MOSFETs and semiconductor memories.

In the first through twelfth embodiments, each embodiment is applied to manufacturing of MOSFETs or semiconductor memories. However, these embodiments can also be applied to manufacturing of IGBTs (Insulated Gate Bipolar Transistors), small-signal devices, or MEMSs (Micro Electro Mechanical Systems).

In the first through twelfth embodiments, the substrate is a semiconductor substrate. However, these embodiments can also be applied to substrates other than semiconductor substrates, such as ceramic substrates, glass substrates, and sapphire substrates.

In the first through twelfth embodiments, carbon dioxide particles are injected onto a metal film or a resin film as an example. However, it is also possible to use other particles that are solid at the time of injecting from a nozzle but gasify in an atmosphere in which the substrate is placed at ordinary temperature or the like. For example, it is possible to use nitrogen particles or argon particles.

In the first through twelfth embodiments, a metal film or a resin film is used as the film formed on the second surface side. However, it is also possible to use an inorganic insulating film such as a nitride film or an oxide film, or the like.

While certain embodiments have been described, these embodiments have been presented by way of example only, and are not intended to limit the scope of the inventions. Indeed, the device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A device manufacturing method comprising:
   forming a metal film on a semiconductor substrate having a first surface and a second surface, the metal film being formed on the second surface side of the semiconductor substrate;
   cutting the semiconductor substrate;
   cutting the metal film; and
   scraping off an intrinsic part of at least one of the semiconductor substrate and the metal film by injecting carbon dioxide particles onto at least one of a first cut portion formed by the cutting of the semiconductor substrate and a second cut portion formed by the cutting of the metal film.

2. The method according to claim 1, wherein the semiconductor substrate and the metal film are cut along a predetermined cutting region.

3. The method according to claim 1, wherein the intrinsic part of the at least one of the semiconductor substrate and the metal film is burr of the one of the first cut portion and the second cut portion.

4. The method according to claim 1, wherein the carbon dioxide particles are injected in a direction tilting at a smaller angle than 90 degrees with respect to one of the first surface and the second surface.

5. The method according to claim 1, wherein the cutting of the semiconductor substrate and the cutting of the metal film are simultaneously conducted by blade dicing from the first surface side.

6. The method according to claim 1, wherein one of the cutting of the semiconductor substrate and the cutting of the metal film is conducted by laser irradiation.

7. The method according to claim 1, wherein the carbon dioxide particles are injected as a spot on the semiconductor substrate or the metal film.

8. The method according to claim 7, wherein a diameter of the spot is not smaller than 3 mm and not greater than 10 mm.

* * * * *